(12) United States Patent
Lai et al.

(10) Patent No.: US 7,959,327 B2
(45) Date of Patent: Jun. 14, 2011

(54) LED LAMP HAVING A VAPOR CHAMBER FOR DISSIPATING HEAT GENERATED BY LEDS OF THE LED LAMP

(75) Inventors: Cheng-Tien Lai, Taipei Hsien (TW); Zhi-Yong Zhou, Shenzhen (CN); Chi-Yuan Lai, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 147 days.

(21) Appl. No.: 12/422,300

(22) Filed: Apr. 13, 2009

(65) Prior Publication Data
US 2010/0103674 A1    Apr. 29, 2010

(30) Foreign Application Priority Data
Oct. 28, 2008   (CN) .......................... 2008 1 0305253

(51) Int. Cl.
*F21V 29/00* (2006.01)
(52) U.S. Cl. .................... 362/294; 362/373; 362/249.02; 257/716

(58) Field of Classification Search .................. 362/373, 362/294, 101, 96
See application file for complete search history.

(56) References Cited

U.S. PATENT DOCUMENTS

| | | | |
|---|---|---|---|
| 5,890,794 A * | 4/1999 | Abtahi et al. | 362/294 |
| 7,819,556 B2 * | 10/2010 | Heffington et al. | 362/294 |
| 7,874,702 B2 * | 1/2011 | Shuai et al. | 362/294 |
| 2005/0174780 A1 * | 8/2005 | Park | 362/294 |
| 2009/0021944 A1 * | 1/2009 | Lee et al. | 362/294 |
| 2009/0129103 A1 * | 5/2009 | Zhang et al. | 362/373 |
| 2009/0168430 A1 * | 7/2009 | Hsu et al. | 362/294 |
| 2009/0268463 A1 * | 10/2009 | Huang et al. | 362/249.02 |

* cited by examiner

*Primary Examiner* — Ali Alavi
(74) *Attorney, Agent, or Firm* — Frank R. Niranjan

(57) ABSTRACT

An LED lamp comprises a lamp housing, a heat sink made of metal and mounted at a bottom side of the lamp housing, a plurality of LED modules, and a vapor chamber having a bottom surface thereof attached to a top surface of the heat sink and having a top surface thereof to which the LED modules are attached, a working liquid is sealed in the vapor chamber. The vapor chamber defines a sealed chamber therein, and the working liquid is phase changeable liquid and is sealed in the sealed chamber. A plurality of ribs is arranged in the vapor chamber for strengthening an integrity of the vapor chamber, and the ribs divide the sealed chamber into a plurality of communicating spaces.

16 Claims, 6 Drawing Sheets

US 7,959,327 B2

LED LAMP HAVING A VAPOR CHAMBER FOR DISSIPATING HEAT GENERATED BY LEDS OF THE LED LAMP

BACKGROUND

1. Technical Field

The present disclosure relates to an LED (light emitting diode) lamp and, more particularly, to an LED lamp having a vapor chamber for removing heat from LEDs of the LED lamp.

2. Description of Related Art

An LED lamp is a type of solid-state lighting that utilizes LEDs as a source of illumination. The LED lamp is intended to be a cost-effective yet high quality replacement for incandescent and fluorescent lamp because the LED has features of long-term reliability, environment friendliness and low power consumption.

The LEDs generally produce large amounts of heat, which may make the LEDs be degraded or even damaged if the heat is not removed from the LEDs efficiently. Although there are many different designs for heat dissipation, the major heat dissipation route for the heat produced by the LEDs usually is managed through the base to which the LEDs is mounted or through an additional metal heat sink below the base and then to an outer heat sink.

Traditional adoption of the fans for active cooling system not only introduces noise problems but also brings risk of damage to an LED lamp if the fan is out of order. In contrast, passive cooling with natural convection is quite, continuous and time-unlimited. However, since a natural convection system is relatively weak for heat dissipation, to solve this problem, a large surface area is needed to enhance heat dissipation capacity. Most passive cooling devices for LED lamps simply use metallic blocks, such as copper or aluminum blocks with extended fins for heat dissipation. However, the thermal dissipation capacities of these simple metal blocks with extended fins may be still insufficient for dissipating the heat generated from the LEDs of the LED lamps, which results in a relatively high temperature of the LED lamps during operation.

What is needed, therefore, is a heat dissipation device for an LED lamp which has an improved heat dissipating structure to thereby overcome the above mentioned disadvantages.

BRIEF DESCRIPTION OF THE DRAWINGS

Many aspects of the present LED lamp can be better understood with reference to the following drawings. The components in the drawings are not necessarily drawn to scale, the emphasis instead being placed upon clearly illustrating the principles of the present LED lamp. Moreover, in the drawings, like reference numerals designate corresponding parts throughout the several views.

DETAILED DESCRIPTION

Figure 1:
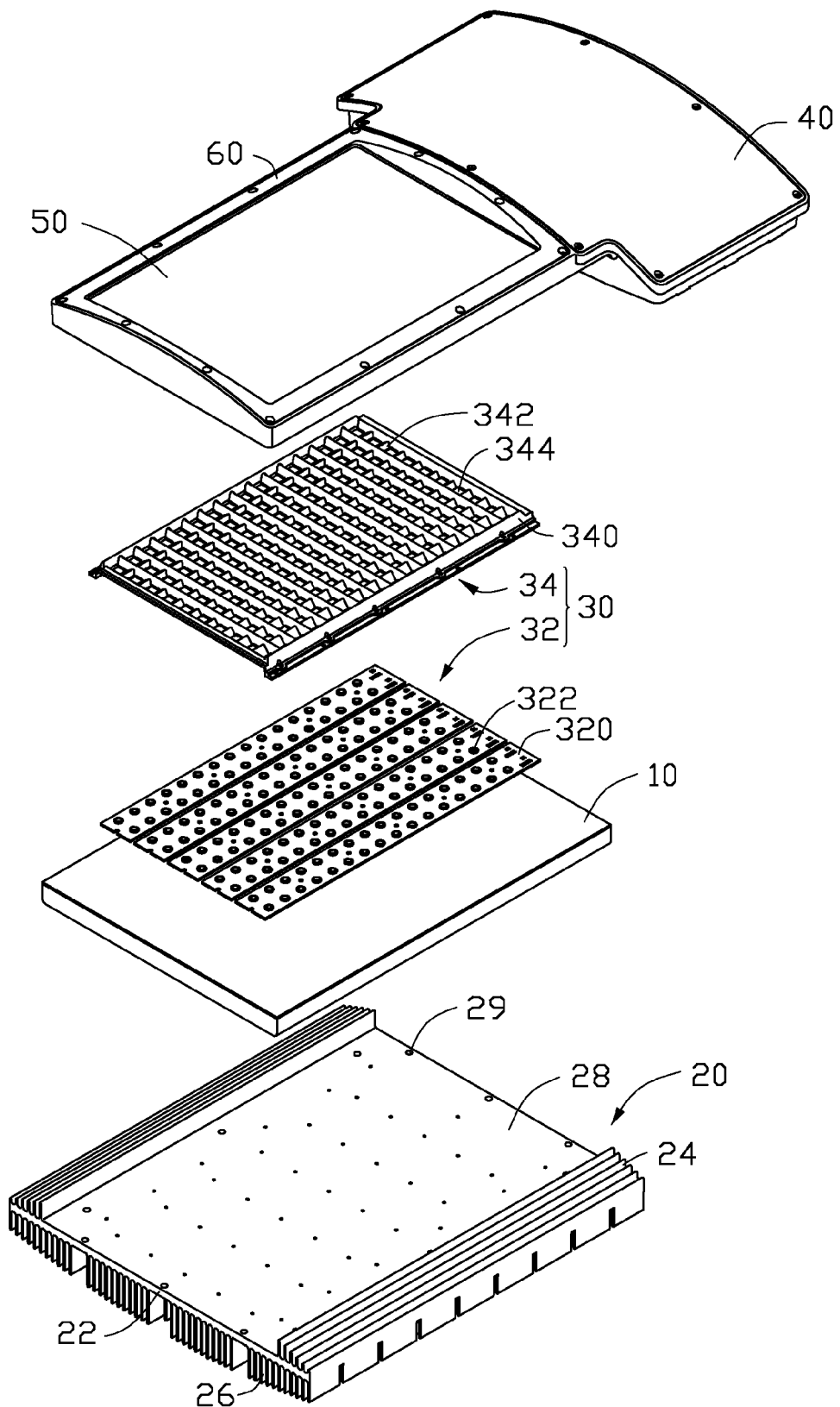
FIG. 1 is an isometric, exploded view of an LED lamp in accordance with a first embodiment of the present disclosure.
Figure 2:
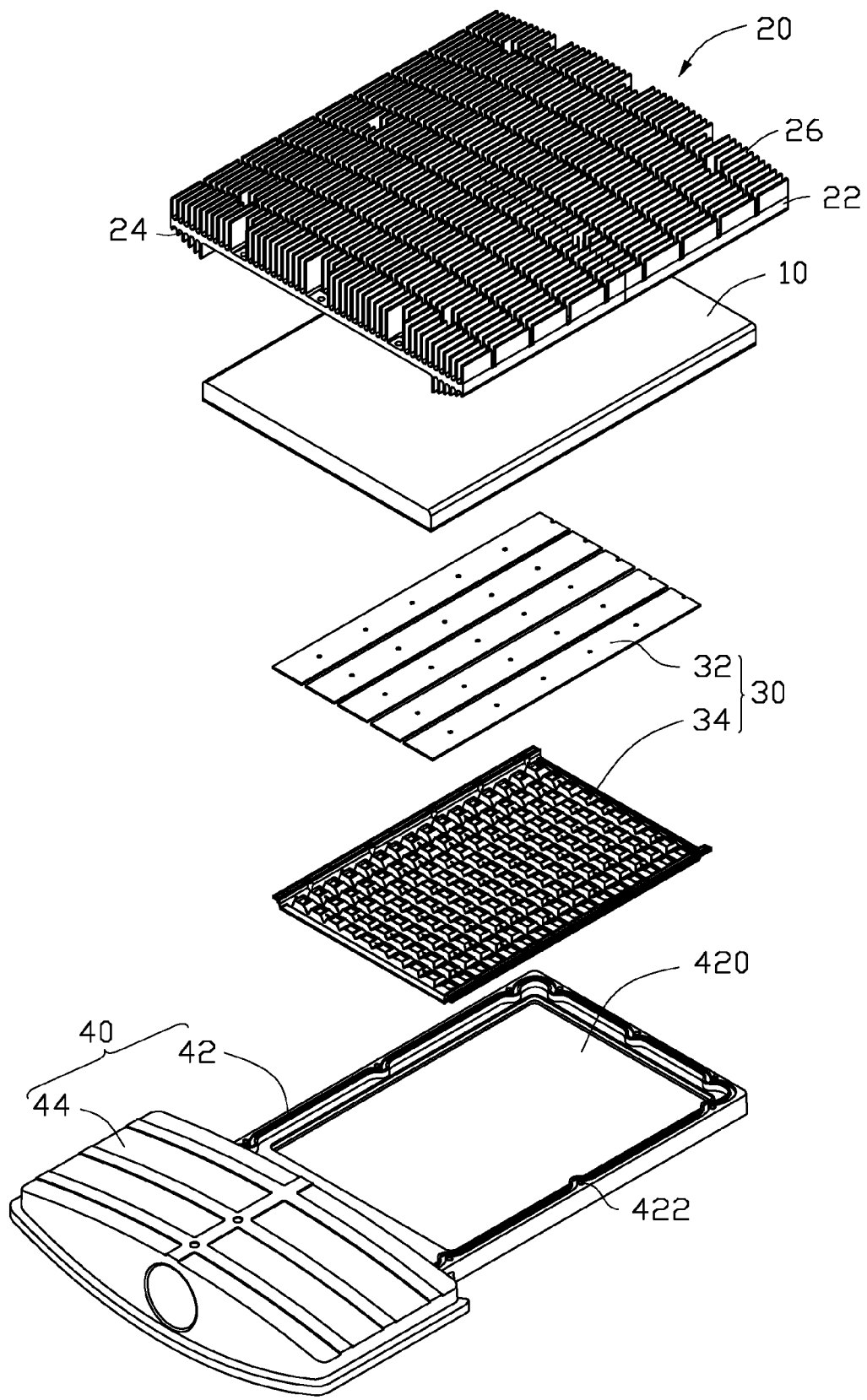
FIG. 2 is an inverted view of FIG. 1.

Referring to FIGS. 1-2, an LED lamp in accordance with a first embodiment of the present disclosure includes a heat sink 20, a vapor chamber 10 attached to a top surface of the heat sink 20, a light emitting unit 30 attached to a top surface of the vapor chamber 20, a lamp housing 40 on the heat sink 20, and an transparent envelope 50 mounted on an upper side of the lamp housing 40 via a pressing cover 60. The lamp housing 40 has an end thereof enclosing the vapor chamber 10 and the light emitting unit 30, and has another end thereof extending beyond the heat sink 20.

The heat sink 20 is made of metal having a good thermal conductivity such as copper or aluminum. The heat sink 20 comprises a flat base 22, a plurality of first fins 24 extending from a top surface of the base 22 and a plurality of second fins 26 extending from a bottom surface of the base 22. The first fins 24 are parallel to each other and extend upwardly from two opposite lateral portions of the base 22, thereby defining a space 28 therebetween for receiving the vapor chamber 10 therein. Height of the first fins 24 gradually increases from two opposite lateral sides to a center of the base 22. The second fins 26 are parallel to each other, and height of the second fins 26 gradually increases from two opposite lateral sides to the center of the base 22, thereby defining an arced bottom face by bottom ends of the second fins 26. The vapor chamber 10 is received in the space 28 and attached to the center of the base 22. A plurality of through holes 29 is defined in the base 22 and around the vapor chamber 10. Screws (not shown) extend through the through holes 29 for securing the lamp housing 40 to the heat sink 20.

Figure 3:
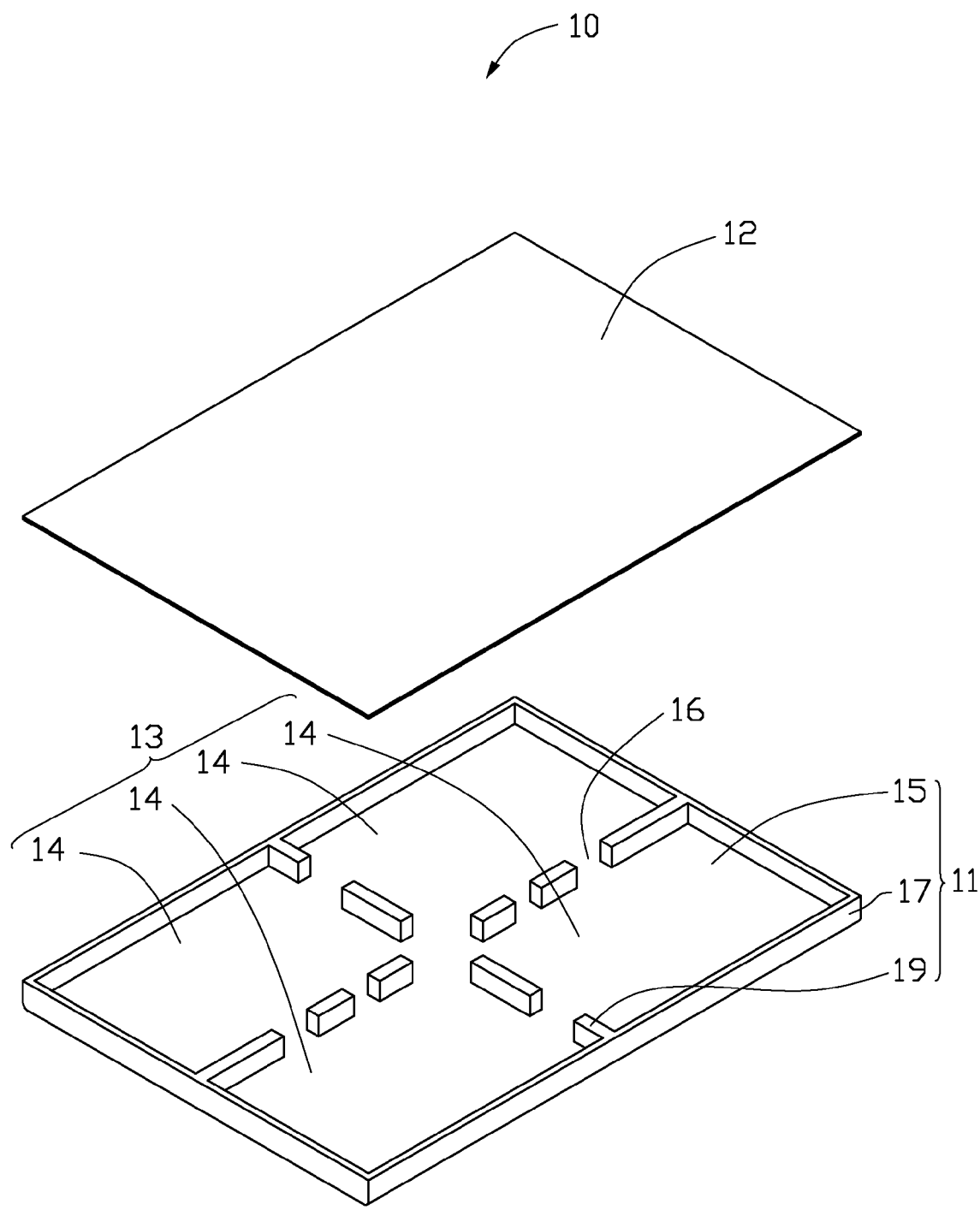
FIG. 3 is an isometric, exploded view of a vapor chamber of the LED lamp of FIG. 1.

Referring to FIG. 3, the vapor chamber 10 has a rectangular plate-shaped configuration. A working liquid is sealed in the vapor chamber 10. The vapor chamber 10 comprises a substrate 11 and a cap 12 incorporating with the substrate 11 to form a sealed chamber 13. The substrate 11 is attached to the top surface of the base 22 of the heat sink 20. The substrate 11 comprises a rectangular bottom plate 15, four side walls 17 extending upwardly and perpendicularly from a circumferential edge of the bottom plate 15 and a plurality of ribs 19 extending upwardly and perpendicularly from the bottom plate 15 for strengthening an integrity of the vapor chamber 10. In an alternative embodiment, the ribs 19 can be disposed on the cap 12; that is, the ribs 19 extend downwardly and perpendicularly from the cap 12. Each rib 19 has a configuration of a quadrangular prism. In this embodiment, each rib 19 is a solid metal block. In other embodiments, the rib 19 can be a hollow metal block or a block having a capillary function, such as a powder sintered block. The ribs 19 are arranged in a cross, thereby dividing the sealed chamber 13 into four symmetrical spaces 14. The ribs 19 are spaced from each other to define a plurality of channels 16 through which the spaces 14 are communicated with each other. Height of the ribs 19 is identical to that of the four side walls 17 of the substrate 11, whereby a peripheral edge of the cap 12 is attached to the side walls 17 of the substrate 11. The working liquid in one of the spaces 14 can flow to another one via the channels 16. A capillary structure (not shown) is attached to inner surfaces of the cap 12 or inner surfaces of both the cap 12 and the substrate 11 for a uniform distribution of the working liquid over the inner surfaces of the cap 12 and a quick return of the working liquid condensed at the substrate 11 back to the cap 12 to avoid a burnout of the working liquid at the cap 12.

The light emitting unit 30 comprises a plurality of LED modules 32 attached to the top surface of the vapor chamber 10 side by side, and a reflector 34 covering the LED modules 32 and mounted on the top surface of the vapor chamber 10. Each of the LED modules 32 comprises a rectangular printed circuit board 320 and a plurality of LEDs 322 mounted on a top surface of the printed circuit board 320. The reflector 34 comprises a rectangular frame 340 having an opening at a center thereof and a plurality of light guiding boards 342 extending crossways from an inner side of the frame 340. The light guiding boards 342 divide the opening of the frame 340 into a plurality of crateriform receiving spaces 344. The receiving spaces 344 receive corresponding LEDs 322 therein.

The lamp housing 40 comprises a rectangular frame body 42 and a shell body 44 extending from an end of the frame body 42. A driving circuit board (not shown) is received in the shell body 44 to connect electronically with the LED modules 32. The frame body 42 defines a void 420 at a center thereof. A bottom portion of the frame body 42 defines a plurality of threaded blind holes 422 corresponding to the through holes 29 of the heat sink 20. Screws extend through the through holes 29 and engage into corresponding threaded blind holes 422 to thereby secure the lamp housing 40 on the heat sink 20. The pressing cover 60 is mounted on a top portion of the frame body 42, whereby the transparent envelope 50 is sandwiched between the frame body 42 and the pressing cover 60 to cover the void 420 of the frame body 42.

In use of the LED lamp, the heat generated by the LEDs 322 of the LED modules 32 is absorbed by the cap 12 of the vapor chamber 10. A part of the heat absorbed by the cap 12 is directly transferred to the bottom plate 15 of the substrate 11 via the ribs 19 by means of heat conduction. The other part of the heat absorbed by the cap 12 evaporates the working liquid in the vapor chamber 10 and accumulated at the capillary structure attached to the inner surfaces of the cap 12 into a vapor. The vapor flows towards the substrate 11, dissipates the heat thereto, and then is condensed into liquid. In this illustrated embodiment, the liquid returns back to the cap 12 with help of gravity for another circulation. In other uses, the liquid returns back to the cap 12 via the capillary structure attached to the inner surfaces of the substrate 11 or via the ribs 19 having a capillary function. Therefore, the other part of the heat absorbed by the cap 12 of the vapor chamber 10 is transferred to the bottom plate 15 of the substrate 11 by means of phase change of the working liquid. At last, the bottom plate 15 of the substrate 11 transfers the heat generated by the LEDs 322 of the LED modules 32 to the heat sink 20. The heat sink 20 dissipates the heat to surrounding air.

The LED lamp in accordance with the present disclosure has a vapor chamber 10 sandwiched between the LED modules 32 and the heat sink 20, whereby the heat generated by the LEDs 322 of the LED modules 32 is transferred quickly to the heat sink 20 via the vapor chamber 10 having a phase change function; thus, the efficiency of heat dissipation of the LED lamp is improved greatly.

Figure 4:
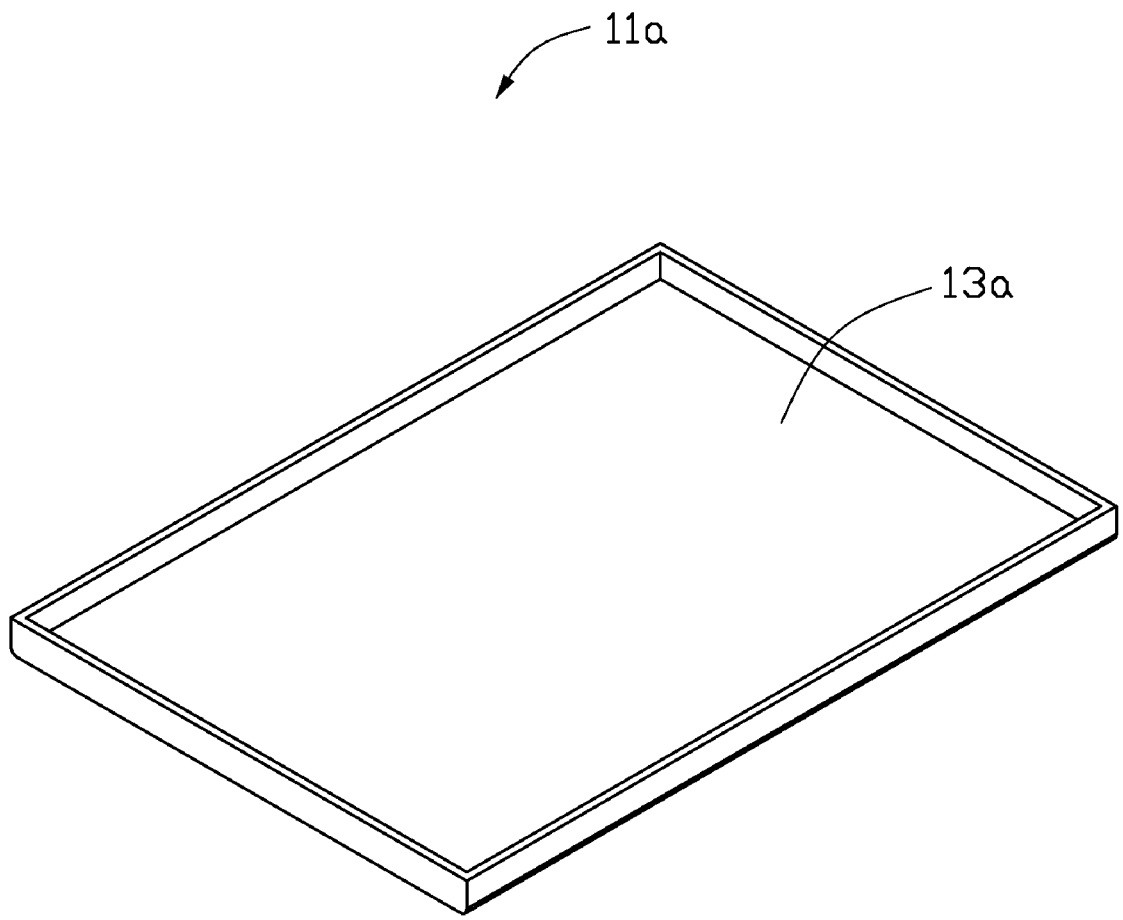
FIG. 4 is an isometric view of a substrate of a vapor chamber of the LED lamp according to a second embodiment of the present disclosure.

Referring to FIG. 4, a substrate 11a in accordance with a second embodiment of the present disclosure is similar to the substrate 11 in the first embodiment. A sealed chamber 13a is formed cooperatively by the substrate 11a and the cap 12. The sealed chamber 13a has no spacing members therein; thus, the ribs 19 in the first embodiment are omitted in this embodiment.

Figure 5:
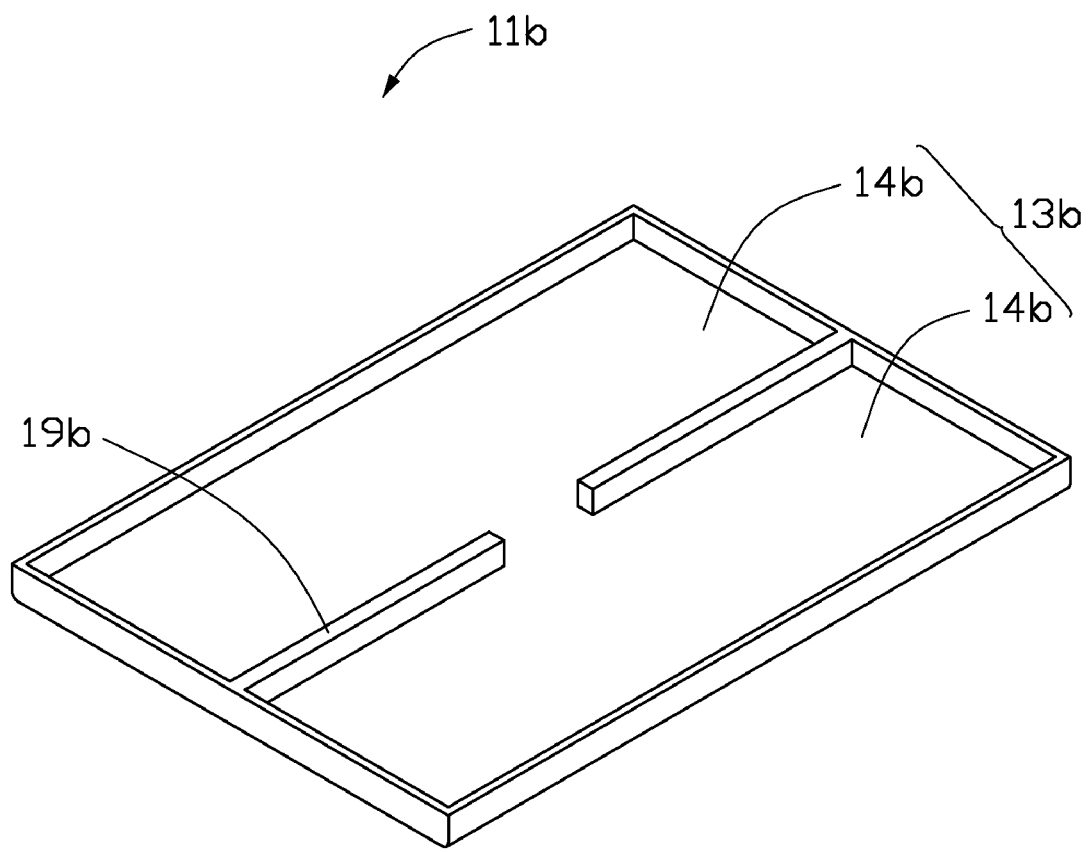
FIG. 5 is an isometric view of a substrate of a vapor chamber of the LED lamp according to a third embodiment of the present disclosure.

Referring to FIG. 5, a substrate 11b in accordance with a third embodiment of the present disclosure is similar to the substrate 11 in the first embodiment. However, a sealed chamber 13b is formed cooperatively by the substrate 11b and the cap 12; the sealed chamber 13b is divided by the ribs 19b into two communicating spaces 14b.

Figure 6:
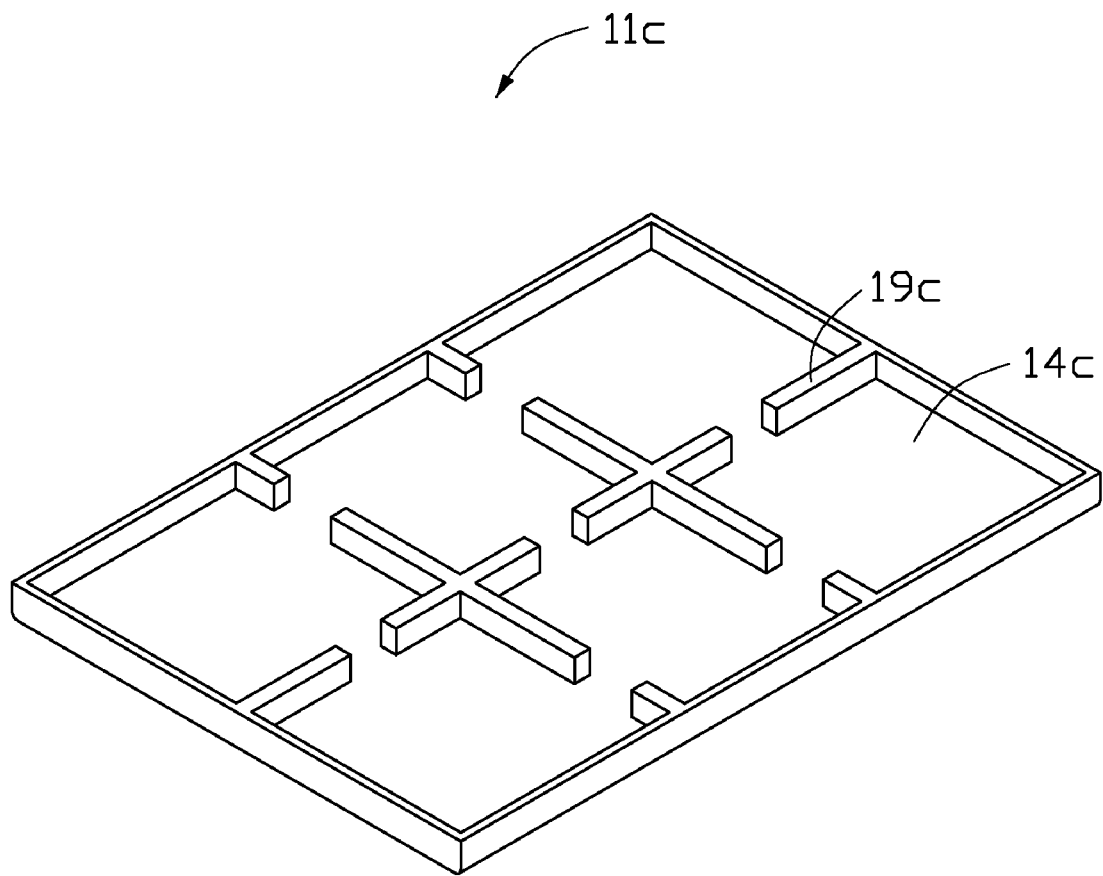
FIG. 6 is an isometric view of the substrate of the vapor chamber of the LED lamp according to a fourth embodiment of the present disclosure.

Referring to FIG. 6, a substrate 11c in accordance with a fourth embodiment of the present disclosure is similar to the substrate 11. However, a sealed chamber (not labeled) formed cooperatively by the substrate 11c and the cap 12 is divided by the ribs 19c into six communicating spaces 14c. It can be understood that the sealed chamber can be divided by the ribs into a plurality of spaces with a different number, according to a different demand of the heat dissipation of the LED lamp.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED lamp comprising:
   a lamp housing;
   a heat sink made of metal and mounted at a side of the lamp housing;
   a plurality of LED modules; and
   a vapor chamber having a bottom surface thereof attached to a top surface of the heat sink and having a top surface thereof to which the LED modules are attached, a working liquid being sealed in the vapor chamber, the vapor chamber defining a sealed chamber therein, a plurality of ribs being formed in the vapor chamber for strengthening an integrity thereof, the ribs dividing the sealed chamber into a plurality of communicating spaces.

2. The LED lamp as claimed in claim 1 further comprising an envelope mounted on the lamp housing, wherein the envelope covers the LED modules.

3. The LED lamp as claimed in claim 1, wherein the ribs are arranged in a crossed shape and are spaced from each other to define channels through which the spaces communicate with each other.

4. The LED lamp as claimed in claim 3, wherein each of the ribs is a block having a capillary function.

5. The LED lamp as claimed in claim 1, wherein the vapor chamber comprises a substrate and a cap incorporating with the substrate to form the sealed chamber, the substrate comprising a bottom plate and four side walls extending upwardly from a circumferential edge of the bottom plate, the bottom plate being attached to the top surface of the heat sink and the LED modules being attached to the cap.

6. The LED lamp as claimed in claim 5, wherein the ribs extend upwardly from the bottom plate.

7. The LED lamp as claimed in claim 5, wherein the ribs extend downwardly from the cap.

8. The LED lamp as claimed in claim 5, wherein height of the ribs is identical to that of the side walls of the substrate of the vapor chamber, a peripheral edge of the cap of the vapor chamber being attached to the side walls of the substrate.

9. The LED lamp as claimed in claim 5, wherein a capillary structure is attached to inner surfaces the cap of the vapor chamber for achieving a uniform distribution of the working fluid over the inner surfaces of the cap.

10. The LED lamp as claimed in claim 1 further comprising a reflector, wherein the reflector comprises a frame having an opening at a center thereof and a plurality of light guiding boards extending crossways from an inner side of the frame, thereby dividing the opening of the frame into a plurality of crateriform receiving spaces.

11. The LED lamp as claimed in claim 10, wherein each of the LED modules comprises a plurality of LEDs, the receiving spaces receiving corresponding LEDs therein.

12. An LED lamp comprising:
 a lamp housing;
 a heat sink made of metal and mounted at a bottom side of the lamp housing, the heat sink comprising a base, a plurality of first fins extending upwards from two opposite lateral portions of the base and a plurality of second fins extending downwards from the base;
 a plurality of LED modules;
 an envelope mounted at a top side of the lamp housing and covering the LED modules; and
 a vapor chamber having a bottom surface thereof attached to a center of a top face of the base of the heat sink and having a top surface thereof to which the LED modules are attached, the vapor chamber being located between the first fins of the heat sink, a working liquid being sealed in the vapor chamber.

13. The LED lamp as claimed in claim 12, wherein the lamp housing comprises a frame body and a shell body extending from an end of the frame body, the heat sink being mounted on a bottom of the frame body, and the shell body laterally extending beyond the heat sink.

14. The LED lamp as claimed in claim 13 further comprising a pressing cover, wherein the pressing cover is mounted a top of the frame body of the lamp housing, the envelope being sandwiched between the frame body and the pressing cover.

15. An LED lamp comprising:
 a lamp housing;
 a heat sink made of metal and mounted at a side of the lamp housing;
 a plurality of LED modules;
 a vapor chamber having a bottom surface thereof attached to a top surface of the heat sink and having a top surface thereof to which the LED modules are attached, a working liquid being sealed in the vapor chamber; and
 a reflector comprising a frame having an opening at a center thereof and a plurality of light guiding boards extending crossways from an inner side of the frame, thereby dividing the opening of the frame into a plurality of crateriform receiving spaces.

16. The LED lamp as claimed in claim 15, wherein each of the LED modules comprises a plurality of LEDs, the receiving spaces receiving corresponding LEDs therein.

* * * * *